(12) United States Patent
Hu et al.

(10) Patent No.: US 11,721,635 B2
(45) Date of Patent: *Aug. 8, 2023

(54) CHIP PACKAGE AND METHOD OF FORMING THE SAME

(71) Applicant: Taiwan Semiconductor Manufacturing Company, Ltd., Hsinchu (TW)

(72) Inventors: Yu-Hsiang Hu, Hsinchu (TW); Chen-Hua Yu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/730,213

(22) Filed: Apr. 27, 2022

(65) Prior Publication Data

US 2022/0254724 A1    Aug. 11, 2022

Related U.S. Application Data

(63) Continuation of application No. 16/164,752, filed on Oct. 18, 2018, now Pat. No. 11,322,450.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/0274* (2013.01); *H01L 21/486* (2013.01); *H01L 21/4857* (2013.01); *H01L 21/56* (2013.01); *H01L 21/6835* (2013.01); *H01L 21/76802* (2013.01); *H01L 21/76877* (2013.01);
(Continued)

(58) Field of Classification Search
CPC ............ H01L 21/0274; H01L 21/4857; H01L 21/486; H01L 21/56; H01L 21/6835; H01L 21/76802; H01L 21/76877; H01L 23/3128; H01L 23/481; H01L 23/5383; H01L 23/5386; H01L 23/5389; H01L 24/19; H01L 24/20; H01L 25/18; H01L 25/50;
(Continued)

(56) References Cited

U.S. PATENT DOCUMENTS 9,000,584 B2    4/2015 Lin et al.
9,048,222 B2    6/2015 Hung et al.
(Continued)

*Primary Examiner* — David C Spalla
(74) *Attorney, Agent, or Firm* — JCIPRNET

(57) ABSTRACT

A chip package includes a semiconductor die laterally encapsulating by an insulating encapsulant, a first dielectric portion, conductive vias, conductive traces and a second dielectric portion. The first dielectric portion covers the semiconductor die and the encapsulant. The conductive vias penetrate through the first dielectric portion and electrically connected to the semiconductor die. The conductive traces are disposed on the first dielectric portion. The second dielectric portion is disposed on the first dielectric portion and covering the conductive traces, wherein a first minimum lateral width of a conductive trace among the conductive traces is smaller than a second minimum lateral width of a conductive via among the conductive vias. A method of forming the chip package is also provided.

20 Claims, 18 Drawing Sheets

(51) Int. Cl.
  *H01L 21/56* (2006.01)
  *H01L 21/683* (2006.01)
  *H01L 21/768* (2006.01)
  *H01L 23/31* (2006.01)
  *H01L 23/48* (2006.01)
  *H01L 23/00* (2006.01)
  *H01L 25/18* (2023.01)
  *H01L 25/00* (2006.01)
  *H01L 21/027* (2006.01)

(52) U.S. Cl.
  CPC ........ *H01L 23/3128* (2013.01); *H01L 23/481* (2013.01); *H01L 23/5383* (2013.01); *H01L 23/5386* (2013.01); *H01L 24/19* (2013.01); *H01L 24/20* (2013.01); *H01L 25/18* (2013.01); *H01L 25/50* (2013.01); *H01L 2221/68359* (2013.01); *H01L 2224/211* (2013.01); *H01L 2224/221* (2013.01)

(58) Field of Classification Search
  CPC ..... H01L 2221/68359; H01L 2224/211; H01L 2224/221
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,322,450 B2 * | 5/2022 | Hu ................. H01L 25/105 |

* cited by examiner

CHIP PACKAGE AND METHOD OF FORMING THE SAME

CROSS-REFERENCE TO RELATED APPLICATION

This application is a continuation application of and claims the priority benefit of a prior application Ser. No. 16/164,752, filed on Oct. 18, 2018 and now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. With the growing demand for miniaturization, higher speed, greater bandwidth and lower power consumption, there is a need for smaller and more creative packaging for semiconductor dies.

Currently, integrated fan-out packages are becoming increasingly popular for their compactness. In the integrated fan-out packages, the formation of the redistribution circuit structure plays an important role during packaging process. It is important to increase process window and, at the same time, to reduce minimum feature size of the redistribution circuit structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
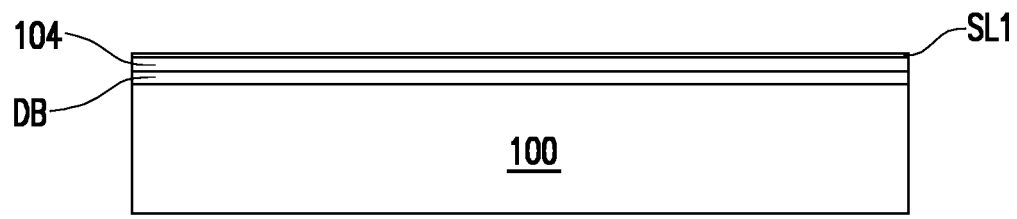
FIGS. 1 through 17 illustrate cross-sectional views of various processing steps during formation of a chip package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 17 illustrate cross-sectional views of various processing steps during formation of a chip package in accordance with some embodiments. A single package region is illustrated in FIGS. 1 through 17, but multiple package regions may be packaged simultaneously, constituting a wafer level packaging process.

Referring to FIG. 1, a carrier 100 having a de-bonding layer DB, a dielectric layer 104 and a seed layer SL1 formed thereon is provided. The de-bonding layer DB is first formed on the carrier 100, then the dielectric layer 104 is formed on the de-bonding layer DB. In some embodiments, the carrier 100 is a glass substrate, the de-bonding layer DB is a light-to-heat conversion (LTHC) release layer formed on the glass substrate, and the dielectric layer 100 is a photosensitive polybenzoxazole (PBO) layer. In alternative embodiments, the carrier 100 may be a ceramic substrate, the de-bonding layer DB may be a photo-curable release film whose viscosity is decreased by a subsequently performed photo-curing process or a thermal curable release film whose viscosity is decreased by a subsequently performed thermal-curing process, and the dielectric layer 104 may be made from other photosensitive or non-photosensitive dielectric materials.

After forming the dielectric layer 104, a seed layer SL1 is formed over the dielectric layer 104. The seed layer SL1 may be formed using, for example, physical vapor deposition (PVD) or the like. The PVD may be sputtering. In some embodiments, the seed layer SL1 is a metal layer, which may be a single layer or a composite layer comprising sub-layers formed of different materials. In some embodiments, the seed layer SL1 includes a titanium layer and a copper layer over the titanium layer.

Figure 2:
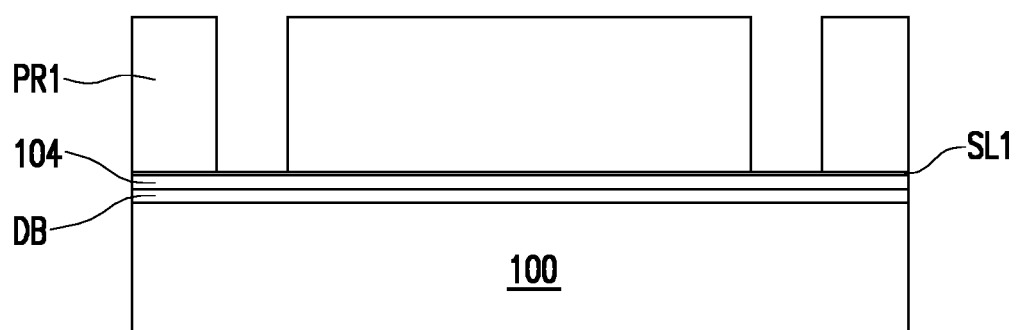

Referring to FIG. 2, after the carrier 100 having the de-bonding layer DB, the dielectric layer 104 and the seed layer SL1 formed thereon is provided, a photoresist PR1 is then formed and patterned on the seed layer SL1. The photoresist PR1 may be formed by spin coating or the like and may be patterned by photolithography to form openings through the photoresist PR1 such that portions of the seed layer SL1 are exposed by the openings in the photoresist PR1.

Figure 3:
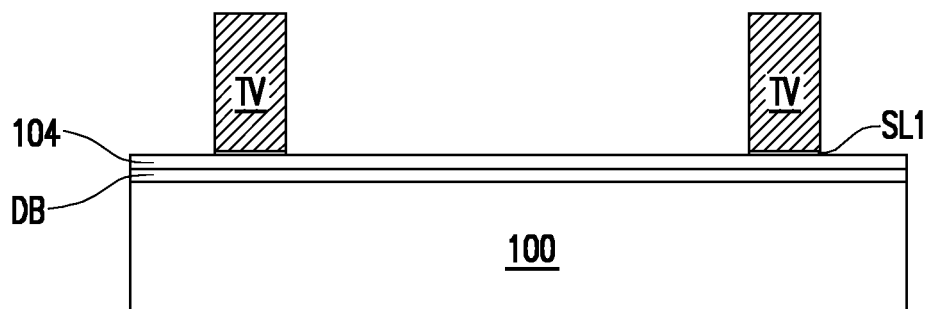

A conductive material is then formed in the openings of the photoresist PR1 and on the exposed portions of the seed layer SL1 such that a plurality of conductive pillars TV are formed on the seed layer SL1. The conductive material may be formed by plating, such as electroplating, electroless plating, or the like. The conductive material may be a metal such as copper, titanium, tungsten, aluminum, or the like. The photoresist PR1 is removed, and then portions of the seed layer SL1 which are not covered by the conductive pillars TV are removed as shown in FIG. 3. In some embodiments, the photoresist PR1 may be removed by any acceptable process, such as by an ashing process, a stripping process, or the like. After the photoresist PR1 is removed, the exposed portions of the seed layer SL1 may then be removed by any acceptable process. In some embodiments, the seed layer SL1 may be partially removed by etching process such as wet etching, dry etching, or the like.

Figure 4:
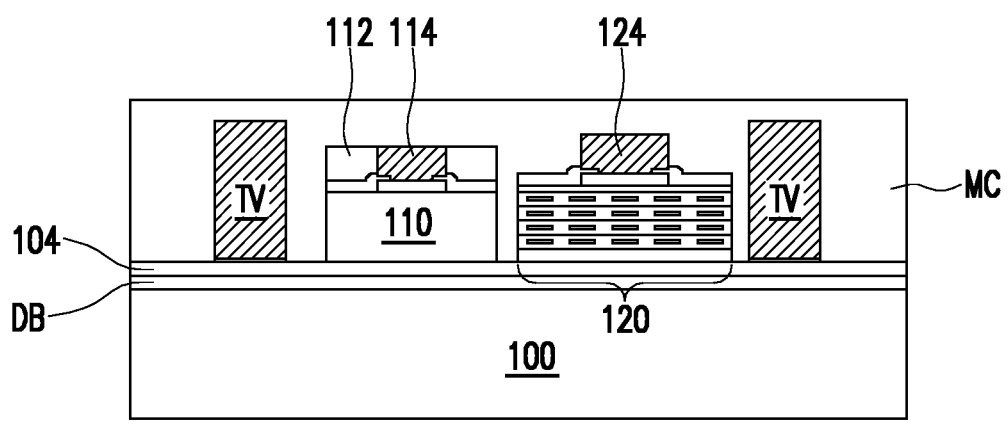

Referring to FIG. 4, semiconductor dies or devices 110 and 120 are then mounted on the dielectric layer 104 and may be surrounded by the conductive pillars TV. In some embodiments, the semiconductor dies 110 and 120 are adhered to the dielectric layer 104 through a die-attach film (DAF) (not shown). The semiconductor die 110 may be a logic die (e.g. central processing units, microcontrollers, etc) while the semiconductor die 120 may be a memory die (e.g. high bandwidth memory (HBM) die, dynamic random access memory (DRAM) die, static random access memory (SRAM) die etc.). In some embodiment, the semiconductor die 120 may be a graphical processing unit (GPU) die. In some embodiments, semiconductor dies 110 and 120 may be power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. The number of semiconductor dies provided on the dielectric layer is not limited to two. In some embodiments, only semiconductor die 110 or semiconductor die 120 is provided on dielectric layer 104. In some alternative embodiments, other semiconductor dies may be provided on dielectric layer 104 in addition to semiconductor dies 110 and 120.

The semiconductor dies 110 and 120 each includes an active surface having a plurality of die connectors 114 and 124 thereon (illustrated as only one for simplicity) respectively. In the semiconductor die 110, a dielectric layer 112 laterally encapsulates the die connectors 114, side surfaces of the die connectors 114 are in contact with the dielectric layer 112, and top surfaces of the die connectors 114 are exposed through the dielectric layer 112. In some alternative embodiments, the die connector 114 may be covered by and encapsulated in the dielectric layer 112. In the semiconductor die 120, the die connectors 124 are not encapsulated within a dielectric layer and therefore side surfaces and top surfaces of the die connectors 124 are exposed. In some embodiments, the semiconductor die 120 may include a dielectric layer that partially or fully encapsulates die connectors 124. The conductive pillars TV, semiconductor die 110 and semiconductor die 120 may have different dimension along the vertical direction (i.e. different height).

After the semiconductor dies 110 and 120 are mounted on the dielectric layer 104, an insulating encapsulant MC are formed to cover the dielectric layer 104, the semiconductor dies 110 and 120 and the conductive pillars TV. The insulating encapsulant MC may be a molding compound, epoxy, or the like, and may be applied by a molding process (e.g. compression molding, transfer molding, or the like). The insulating encapsulant MC is applied to a level covering the top surfaces of the conductive pillars TV and the semiconductor dies 110 and 120.

Figure 5:
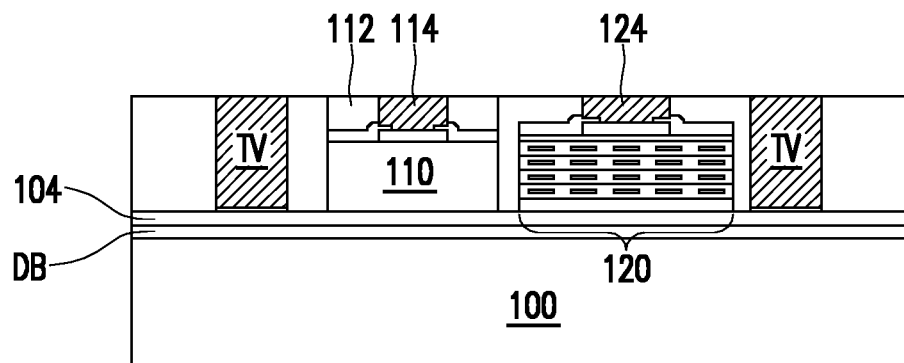

Referring to FIG. 5, the insulating encapsulant MC are partially removed to expose the top surfaces of the conductive pillars TV, the die connectors 114 and the die connectors 124. Preferably, after partially removing the insulating encapsulant MC, the top surface of the remaining insulating encapsulant MC is substantially leveled with the exposed top surfaces of the conductive pillars TV, the die connectors 114 and the die connectors 124. The partial removal of the insulating encapsulant MC may be performed by a grinding process and/or a planarization process such as a chemical mechanical polishing (CMP) process.

Figure 9:
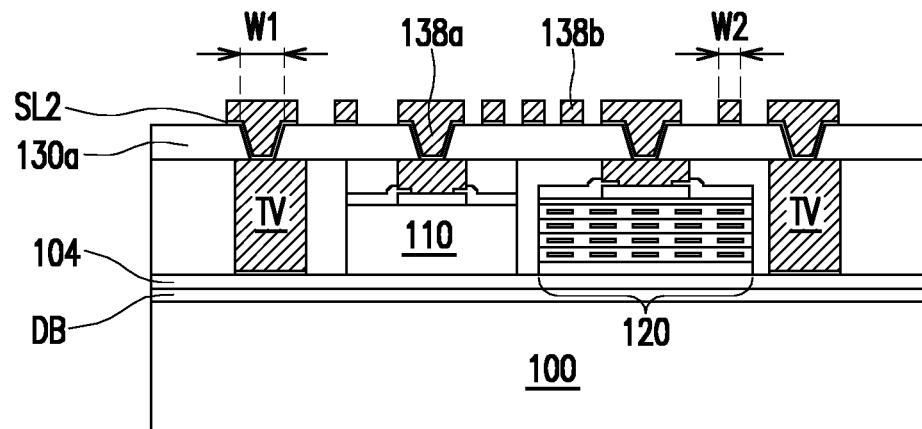
Figure 10:
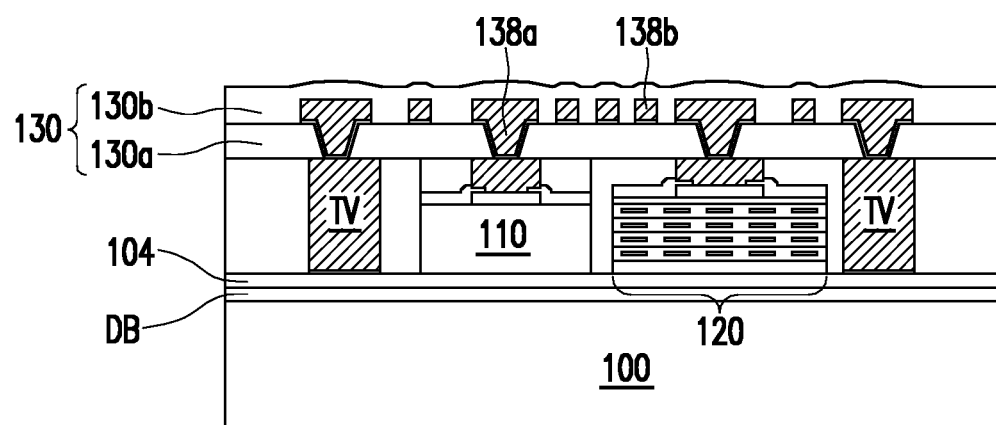
Figure 11:
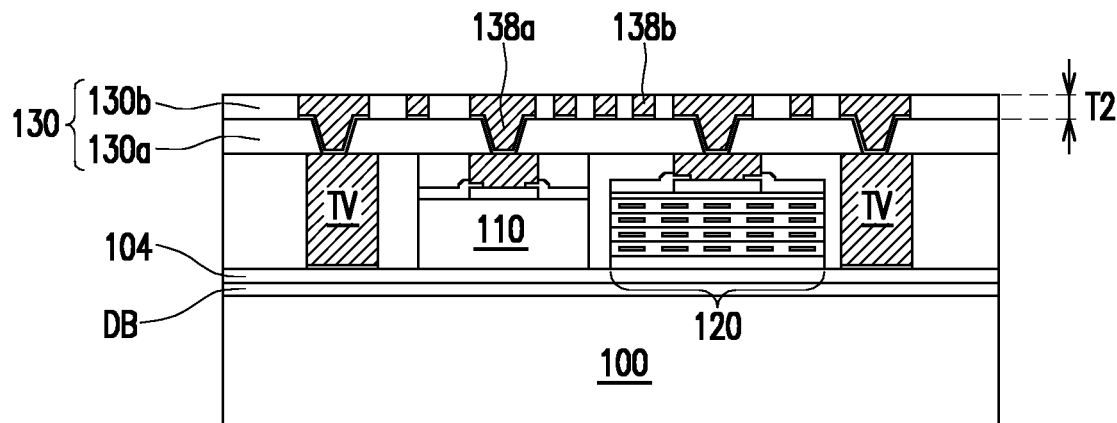

Referring to FIGS. 6 through 11, after partially removing the insulating encapsulant MC, a redistribution layer (RDL) 130 is formed over the semiconductor dies 110 and 120, the conductive pillars TV and the insulating encapsulant MC. As illustrated in FIG. 11, the RDL 130 includes a dielectric portion 130a, a dielectric portion 130b, conductive features 138a and conductive features 138b. Conductive features 138a and conductive features 138b are referred to as redistribution lines. In some embodiments, conductive features 138a and conductive features 138b are formed by a damascene process, described in detail below with reference to FIGS. 6 through 9. In some embodiments, the RDL 130 is a fine pitch RDL having critical dimension less than 1.0 μm.

Figure 6:
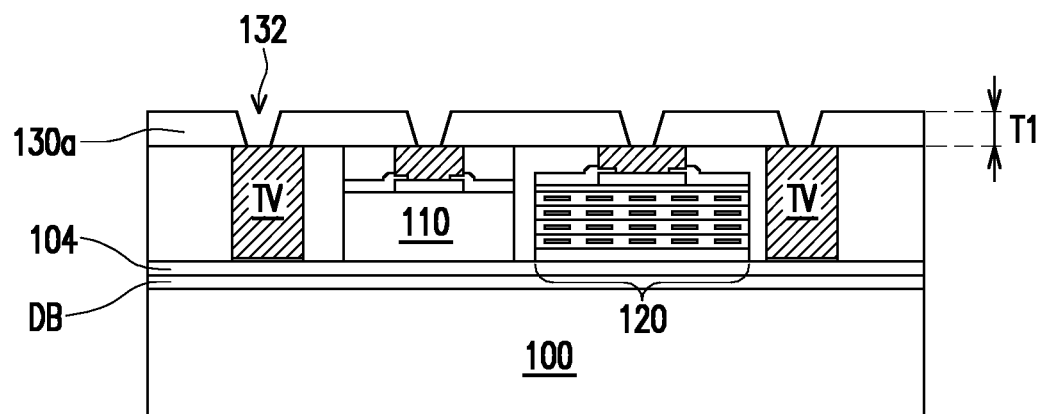

In FIG. 6, dielectric portion 130a is provided on the semiconductor dies 110 and 120, the conductive pillars TV and the insulating encapsulant MC. The dielectric portion 130a is then patterned to form via openings 132 exposing conductive pillars TV and semiconductor dies 110 and 120. The via openings 132 may be formed to have a tapered shape in the cross-sectional view. The via openings 132 may be tapered to have a smaller diameter near the conductive pillar TV.

In detail, the dielectric portion 130a is first evenly deposited, then a photolithography process is performed to pattern the dielectric portion 130a, and then a curing process is performed on the patterned dielectric portion 130a. In some embodiments, the even deposition of dielectric portion 130a provide a top surface that is substantially level or planar, which may be desirable in subsequent fabrication processes. In some embodiment, an additional planarization process such as CMP may be performed on the dielectric portion 130a before or after the patterning process. In some embodiments, the dielectric portion 130a is formed of a polymer, which may be a photosensitive material such as PBO, polyimide, benzocyclobutene (BCB), or the like, that may be patterned using photolithography process. In some embodiments, the dielectric portion 130a may be formed by any acceptable deposition process, such as spin coating, chemical vapor deposition (CVD), laminating, the like, or a combination thereof. After the dielectric portion 130a is patterned and leaving behind a substantially level or planar top surface, the dielectric portion 130a may have a thickness T1 of between about 0.2 μm to about 5.0 μm.

Figure 7:
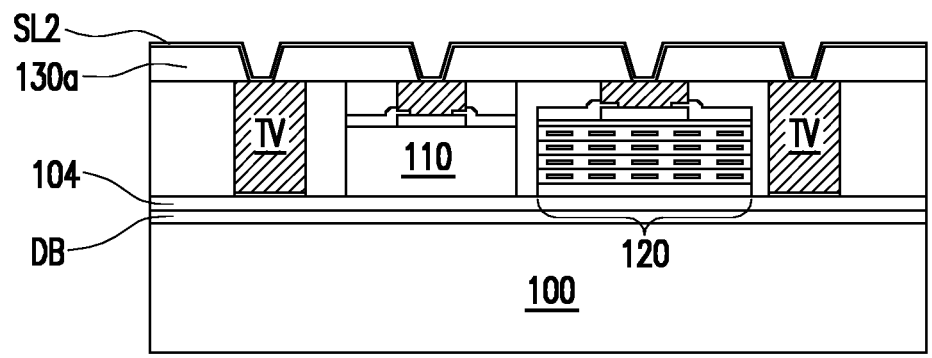

Referring to FIG. 7, a seed layer SL2 is formed on the patterned dielectric portion 130a and the exposed portions of the conductive pillar TV and the semiconductor dies 110 and 120. That is, the seed layer SL2 is formed on the dielectric portion 130a conformal to the shape of the via openings 132. The seed layer SL2 may be formed using, for example, PVD or the like. The PVD may be sputtering. In some embodiments, the seed layer SL2 is a metal layer, which may be a single layer or a composite layer comprising sub-layers formed of different materials. In some embodiments, the seed layer SL2 includes a titanium layer and a copper layer over the titanium layer.

Figure 8:
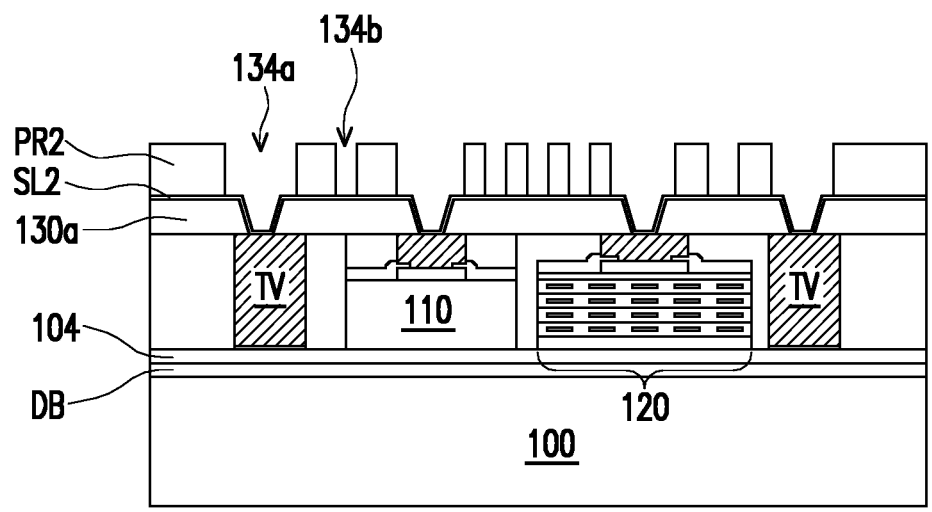

Referring to FIG. 8, after the seed layer SL2 is formed, a photoresist PR2 is then formed over the seed layer SL2 and patterned. The photoresist PR2 is patterned to form a plurality of trenches above the via openings 132 which defines the conductive features formed therein in later processes. Details of the conductive features will be described below. The photoresist PR2 may be patterned by photolithography to form plurality of trenches through the photoresist PR2 such that portions of the seed layer SL2 are exposed by the trenches in the photoresist PR2. The plurality of trenches includes openings 134a formed directly over and exposing the via openings 132, and trenches 134b exposing seed layer SL2 in communicating to the openings 134a. As illustrated in the cross-sectional view of FIG. 8, the trenches 134b are formed adjacent to the openings 134a. In some embodiments, the openings 134a and the trenches 134b are not tapered.

Referring to FIG. 9, after the photoresist PR2 is formed and patterned, a conductive material is then formed in the openings 134a and trenches 134b of the photoresist PR2 and on the exposed portions of the seed layer SL2 such that conductive features 138a and conductive features 138b are formed on the seed layer SL2. The conductive material may be formed by plating, such as electroplating, electroless plating, or the like. The conductive material may be a metal such as copper, titanium, tungsten, aluminum, or the like. The photoresist PR2 is removed, and then portions of the seed layer SL2 which are not covered by the conductive features 138a and 138b are removed. In some embodiments, the photoresist PR2 may be removed by any acceptable process, such as by an ashing process, a stripping process, or the like. After the photoresist PR2 is removed, the exposed portion of the seed layer SL2 may then be removed by any acceptable process. In some embodiments, the seed layer SL2 may be partially removed by etching process such as wet etching, dry etching, or the like.

Still referring to FIG. 9, the conductive features 138a refer to the portion of conductive material embedded in the dielectric portion 130a. That is, the conductive features 138a are conductive vias which electrically connect the conductive pillar TV and the semiconductor dies 110 and 120 to the conductive features 138b disposed above the conductive features 138a. The conductive features 138b refer to conductive features that lies between the top surface of the dielectric portion 130a and the top surface of the dielectric portion 130b (as will be discussed later). In a top view (not shown), the conductive features 138b may be illustrated as fine pitched conductive traces that extends along the surface of the dielectric portion 130a for increased routing density.

The conductive features 138a may have a largest lateral width W1 of between about 1.0 µm to about 5.0 µm. The conductive features 138b may have a lateral width (also referred to as line width) W2 of between about 0.2 µm to about 0.9 µm. In some embodiments, the critical dimension of the conductive features 138b is smaller than the critical dimension of the conductive features 138a. In some embodiment, the critical dimension refers to the minimum lateral width of one conductive feature among plurality of conductive features. In some embodiments, the critical dimension of the conductive features 138a may be between about 1.0 µm to about 5.0 µm. In some embodiments, the critical dimension of the conductive features 138b may be between about 0.2 µm to about 0.9 µm.

Referring to FIGS. 10 and 11, a dielectric portion 130b is formed over the dielectric portion 130a covering the entirety of the conductive features 138b. Due to the topography of conductive features 138b, the dielectric portion 130b formed thereon has a surface with low degree of planarization (DOP). That is, the dielectric portion 130b may have a plurality of protruding features corresponding to the conductive features 138b disposed thereunder. The dielectric portion 130b with a top surface of low DOP is shown in FIG. 10. DOP is a measure of topography of a surface. Higher DOP indicates a surface is more planar, whereas low DOP indicates an uneven surface. Here, the DOP is evaluated using the equation $$DOP = \left(1 - \frac{t_s}{t}\right) \times 100\%,$$

wherein $t_s$ is the height of the protruding feature and $t$ is the height of the feature underlying the protruding feature. The height of the protruding feature is measured from the base of the incline of the protruding feature vertically upwards to the peak level of the protruding feature. In some embodiment, the DOP of dielectric portion 130b formed covering the conductive features 138b may be between about 48% and about 100%. In some embodiment, the dielectric portion 130b is formed of a same material as the dielectric portion 130a. In some embodiment, the dielectric portion 130b may be a polymer, which may be a photosensitive material such as PBO, polyimide, benzocyclobutene (BCB), or the like. In some embodiment, the dielectric portion 130b may be formed from a non-photosensitive material. The dielectric portion 130b may be formed by spin coating, lamination, chemical vapor deposition (CVD), the like, or a combination thereof.

In FIG. 11, the uneven top surface of the dielectric portion 130b is planarized to expose top surfaces of the conductive features 138b and achieve a high DOP of between about 90% to about 100%. That is, after planarizing the dielectric portion 130b, the top surface of dielectric portion 130b and the top surface of the conductive features 138b is substantially coplanar. The dielectric portion 130b may have a thickness T2 after the planarization process. In some embodiments, thickness T2 may be between about 0.2 µm to about 0.9 µm.

Figure 12:
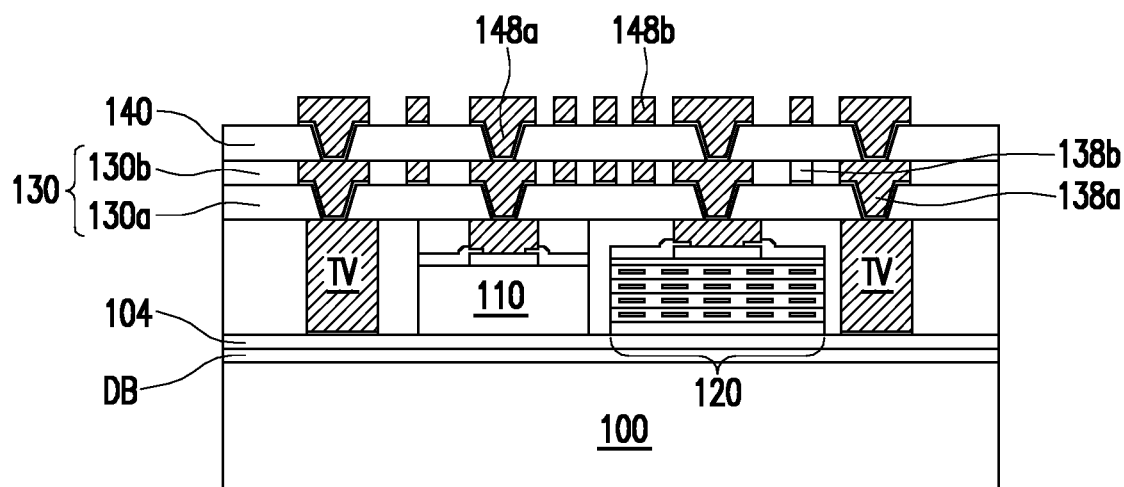

FIG. 12 illustrates the formation of additional RDL over the first RDL 130. The additional RDL includes dielectric portion 140, conductive features 148a and conductive features 148b. The materials used and the process of forming the additional RDL may be the same as the process of forming RDL 130 illustrated in FIGS. 6 through 9.

In some embodiments, the additional RDL is a fine pitch RDL for high density routing having critical dimensions similar to the RDL 130. In other words, the dielectric portion 140 may be similar to dielectric portion 130a, the conductive features 148a may be conductive vias that is similar to conductive features 138a, and the conductive features 148b may be redistribution lines formed above conductive features 148a that is similar to conductive features 138b. Details of which are not repeated herein. In some embodiments, the materials used to form the additional RDL may be different from the RDL 130. In an alternative embodiment, the formation of the additional RDL including the dielectric portion 140, the conductive features 148b and 148b shown in FIG. 12 is omitted. That is, only one fine pitch RDL 130 is formed. In some other embodiment, more than one additional fine pith RDL is formed on the RDL 130. That is, the processes of FIGS. 6 through 11 may be repeatedly performed on RDL 130.

Due to the planarization of dielectric portion 130b and conductive features 138a and 138b, a surface with high DOP is provided for additional fine pitch RDL to be formed thereon. The high DOP allows the additional fine pitch RDL to be formed with larger process window, thus increasing the yield rate of fine pitch packaging process. That is, due to the dielectric portion 130b having good surface planarity, the dielectric portion 140 may be formed with high DOP thereon. Subsequent patterning (i.e. photolithography) process performed thereon may have good resolution, and fine pitch redistribution layer may be achieved.

Figure 13:
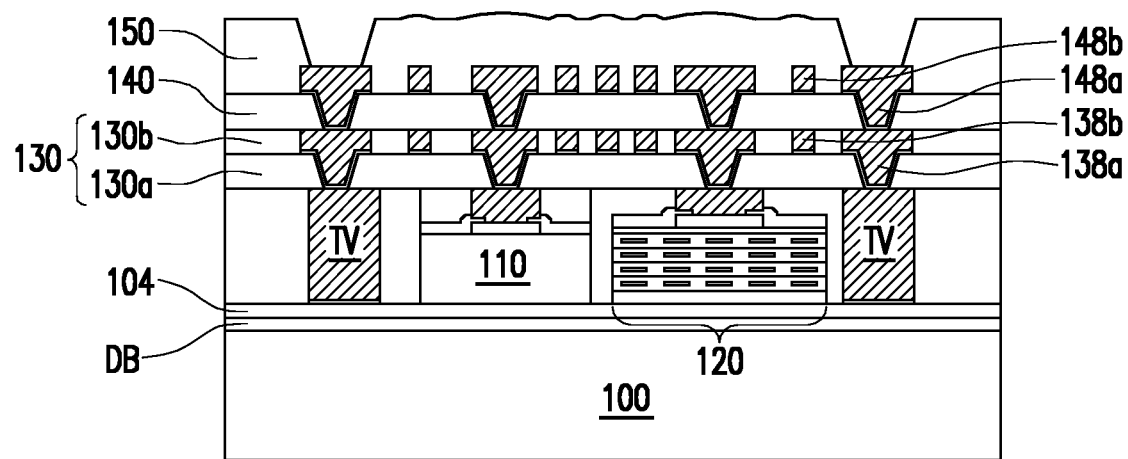
Figure 14:
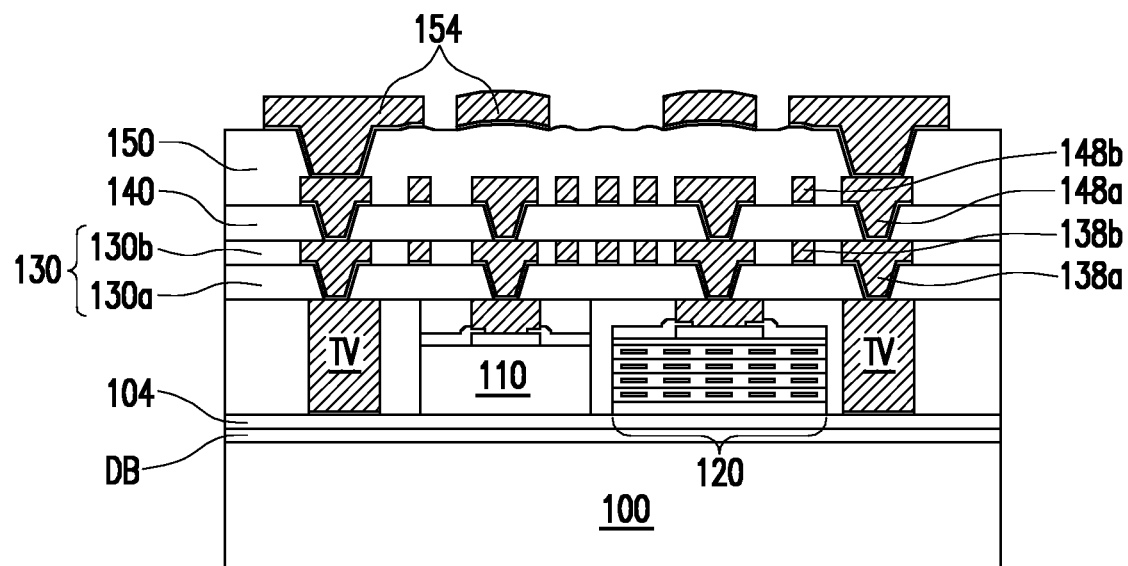

Referring to FIGS. 13 through 14, after forming the additional redistribution layer with the dielectric portion 140, conductive features 148a and the conductive features 148b as shown in FIG. 12, a large scaled redistribution layer including dielectric portion 150 and conductive features 154 are formed thereon. The large scaled redistribution may have critical dimension between about 1 μm to about 50 μm.

In FIG. 13, dielectric portion 150 is formed covering the entirety of conductive features 148b and patterned to expose some of the conductive features 148b. In some embodiment, the dielectric portion 150 may be formed of a photosensitive dielectric material. The dielectric portion 150 may be formed with greater thickness and patterned with wider opening. Despite the topography of the conductive features 148b, due to the relatively greater thickness of the dielectric portion 150, a relatively high DOP may still be maintained. Moreover, because dielectric portion 150 does not correspond to a fine pitch redistribution layer, the patterning of dielectric portion 150 have a larger process window and planarization maybe omitted.

Referring to FIG. 14, conductive features 154 are formed in the patterned openings of the dielectric portion 150 and on the top surface of the dielectric portion 150. In some embodiment, a seed layer is first formed conformal to the patterned dielectric portion 150, and photoresist is then formed on the seed layer and subsequently patterned to form openings exposing part of the seed layer. Conductive materials are then plated in the openings of the photoresist layer and on the exposed seed layer to form the conductive features 154. Here, the conductive features 154 collectively refer to the conductive features which connects conductive feature 148b to the top surface of the dielectric portion 150 and conductive features which is above the dielectric portion 150 which performs redistribution function. The process of forming conductive features 154 may be similar to the process of forming the conductive features 138a and the conductive features 138b discussed above with reference to FIGS. 7 to 9.

Figure 15:
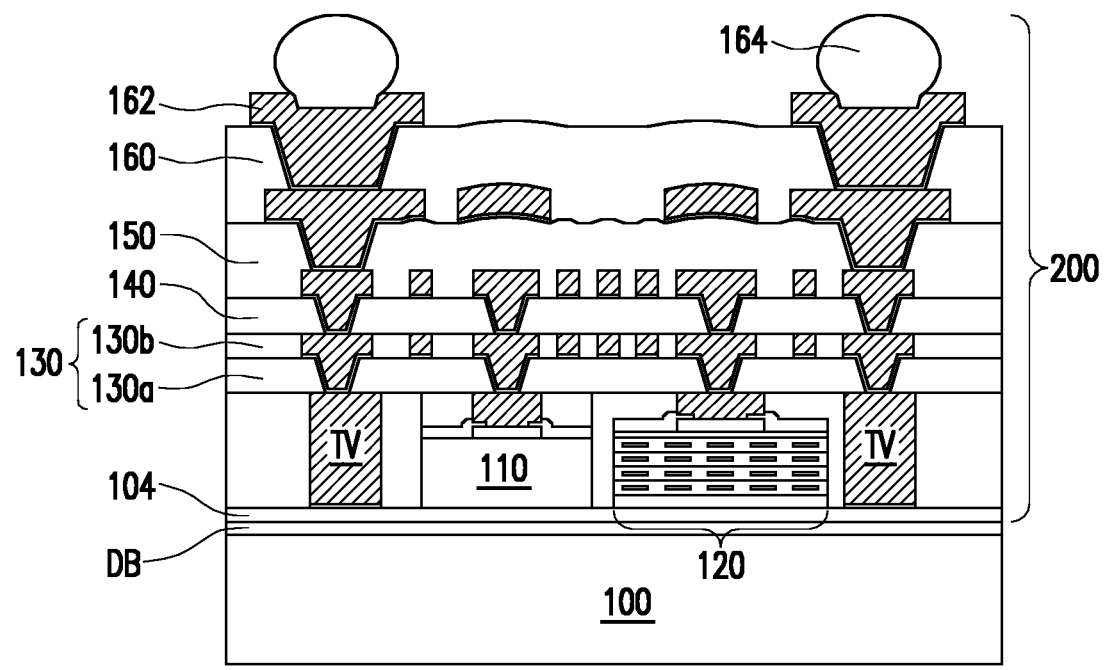

In FIG. 15, a dielectric portion 160, under-ball metallurgies (UBM) 162 and conductive connectors 164 are formed. In detail, the dielectric portion 160 is formed on the dielectric portion 150 and covering the conductive features 154. In some embodiments, the dielectric portion 160 is a photosensitive dielectric material. The dielectric portion 160 is then patterned to form openings exposing conductive features 154. Conductive material is then plated in the openings to form the UBMs 162. The process of forming UBMs 162 may be similar to the process of forming the conductive features 138a and the conductive features 138b discussed above with reference to FIGS. 7 to 9.

After forming UBMs 162, conductive connectors 164 are then formed on the UBMs 162. In some embodiments, the conductive connectors 164 may be ball grid array (BGA) connectors, solder balls, metal pillars, controlled collapse chip connection (C4) bumps, micro bumps, or the like. The conductive connectors 164 may include conductive materials such as solder, copper, aluminum, gold, nickel, silver, palladium, tin, or the like, or the combination thereof. In some embodiments, the conductive connectors may be formed by initially forming a layer of solder on the UBMs 162 followed by a reflow process. After forming the conductive connectors 164, a package 200 with front side redistribution structure is accomplished.

Figure 16:
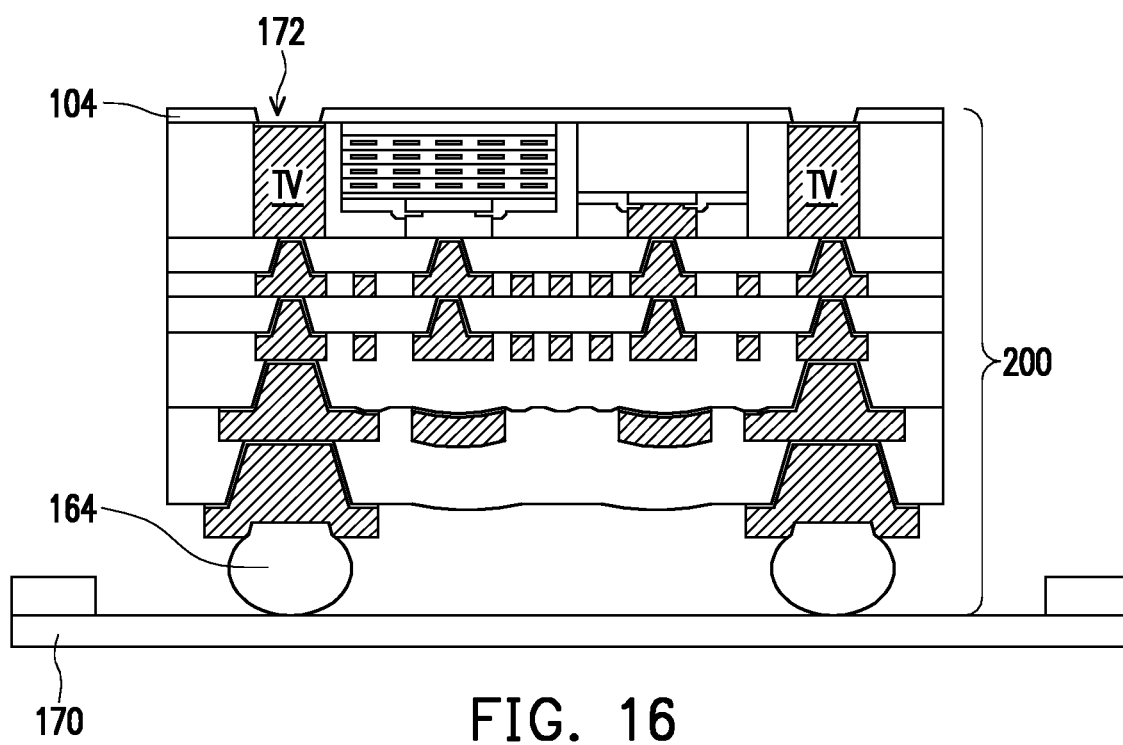

Next, referring to FIG. 16, after the conductive connectors 164 are formed, the dielectric layer 104 is de-bonded from the de-bonding layer DB such that the dielectric layer 104 is separated or delaminated from the de-bonding layer DB and the carrier 100. In some embodiments, the de-bonding layer DB (e.g., the LTHC release layer) may be irradiated by an UV laser or other suitable photo curing process such that the dielectric layer 104 is peeled from the de-bonding layer DB and the carrier 100. In some alternative embodiments, the de-bonding layer DB may be treated by an acceptable thermal curing process such that the dielectric layer 104 is peeled from the de-bonding layer DB and the carrier 100.

After the de-bonding process, a plurality of packages 200 in wafer form is flipped and placed on a carrier tape 170. The dielectric layer 104 is then patterned to form opening 172 exposing the seed layer SL1 on the conductive pillar TV. In some embodiments, the dielectric layer 104 may be a photosensitive dielectric material and the patterning is performed by photolithography process.

Figure 17:
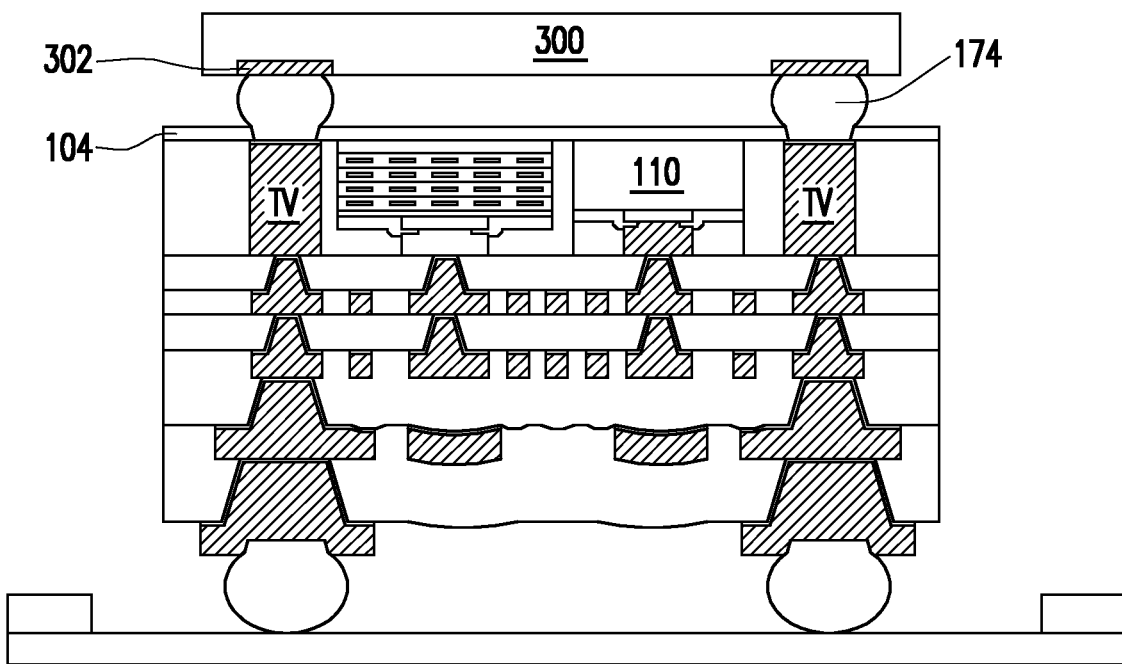

Referring to FIG. 17, a bonding of package 300 to package 200 is illustrated, thus forming a Package-on-Package (PoP) structure. The bonding is performed through connectors 174, which physically and electrically connects conductive pillars TV to metal pads 302 in the overlying package 300. Connectors 174 connects to the conductive pillar TV through opening 172. In some embodiments, package 300 includes semiconductor dies which may be memory dies such as SRAM dies, DRAM dies, or the like.

Figure 18:
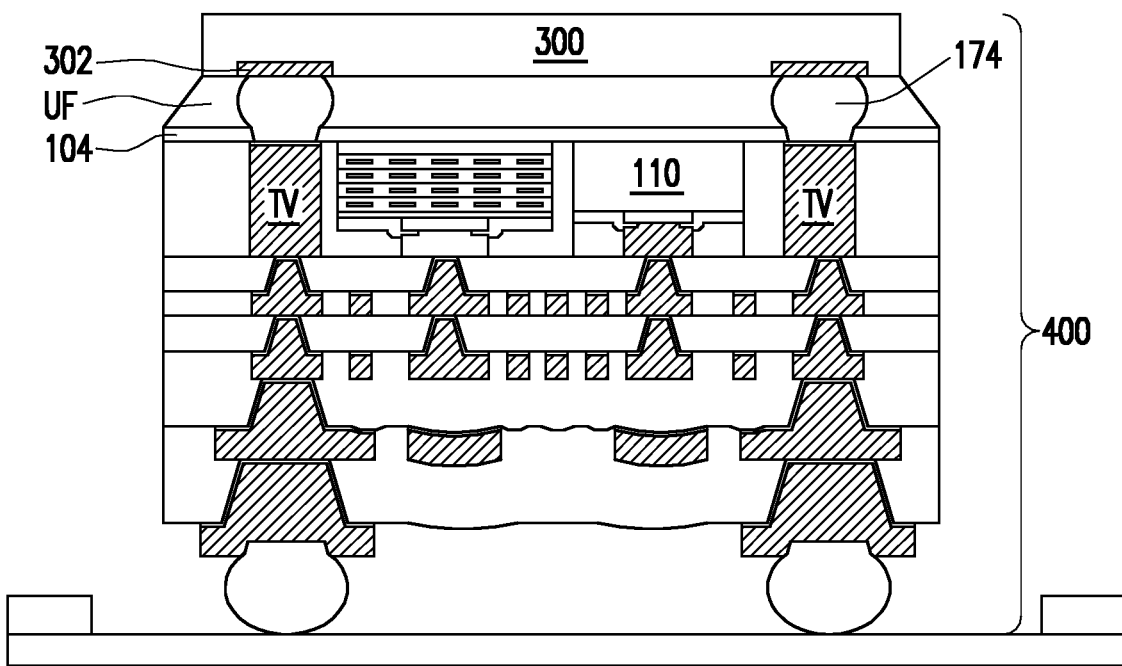
FIG. 18 illustrates cross-sectional view of a chip package in accordance with some embodiments.

In FIG. 18, an underfill UF is formed in the gap between packages 200 and the overlying packages 300, and is cured. The underfill UF may be a polymer, an epoxy, a resin or the like. After the underfill UF is disposed and cured, a singulation process is performed to separate the plurality of packages 200 and packages 300 in wafer form into a plurality of individual packages 400 each having at least one package 200 and at least one package 300.

FIGS. 19 through 29 illustrate cross-sectional views of various processing steps during formation of a redistribution structure in accordance with some other embodiments. A single package region is illustrated in FIGS. 19 through 29, but multiple package regions may be packaged simultaneously, constituting a wafer level packaging process.

Figure 22:
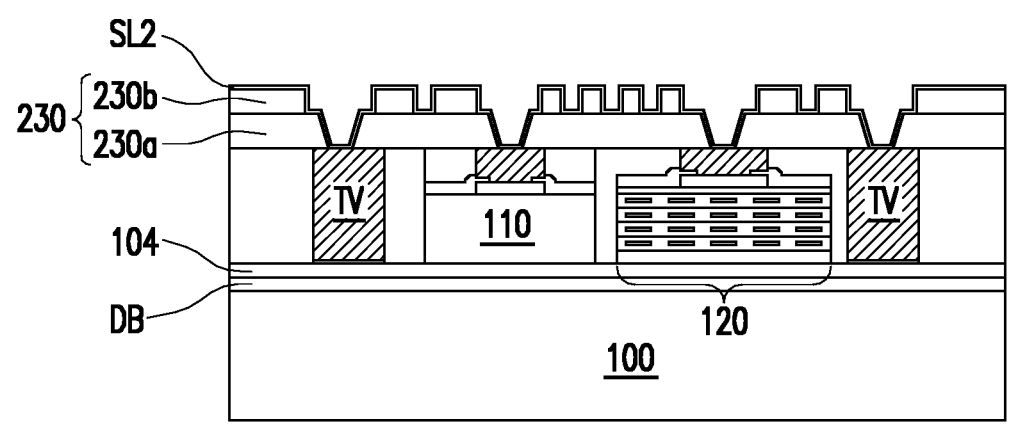
Figure 23:
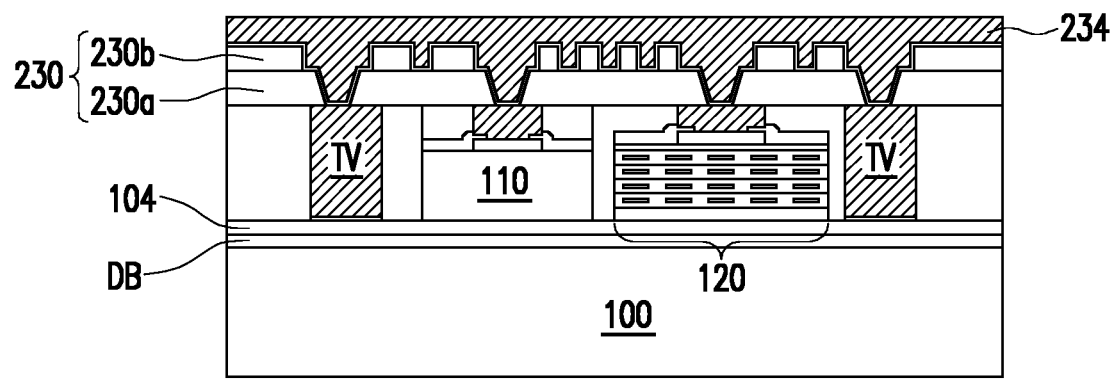
Figure 24:
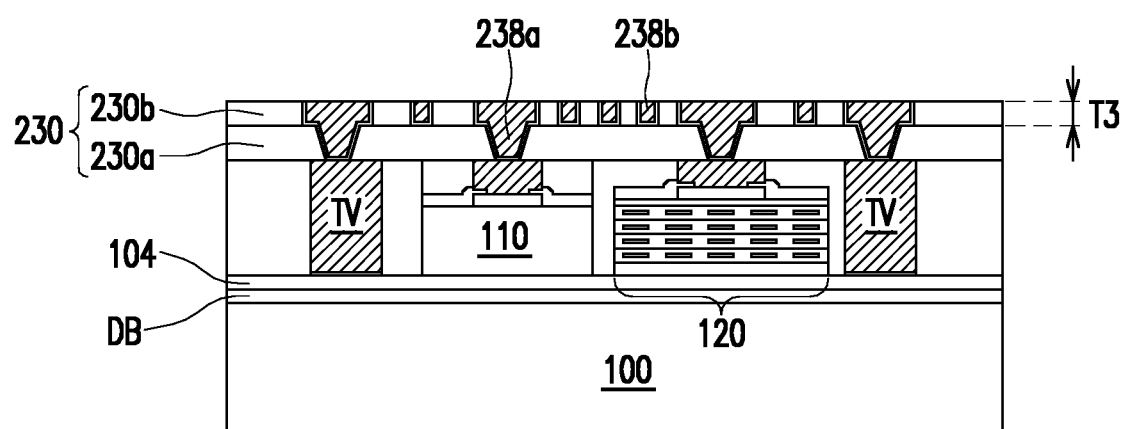

Referring to FIGS. 19 through 24, a RDL 230 is formed over the semiconductor dies 110 and 120, the conductive pillars TV and the insulating encapsulant MC. As illustrated in FIG. 24, the RDL 230 includes a dielectric portion 230a, a dielectric portion 230b, conductive features 238a and conductive features 238b. Conductive features 238a and conductive features 238b are referred to as redistribution lines. In some embodiments, conductive features 238a and conductive features 238b are formed by a damascene process, described in detail below. In some embodiments, the RDL 230 is a fine pitch RDL having critical dimension less than 1.0 μm.

Figure 19:
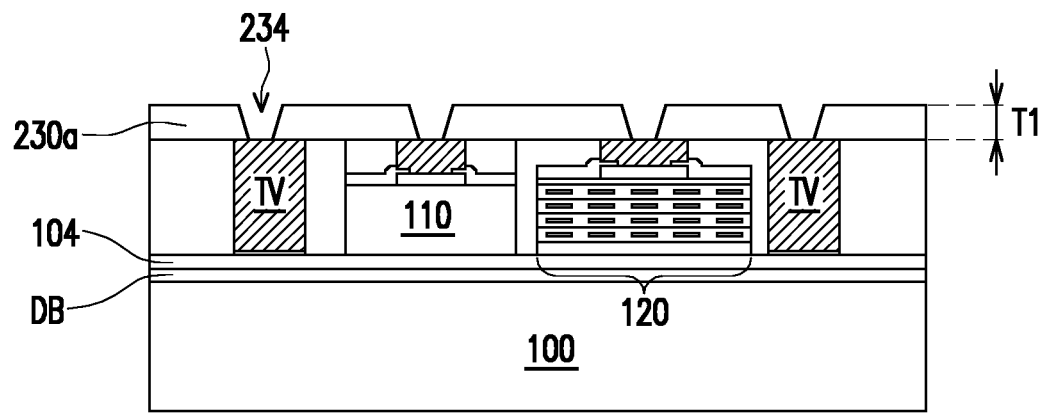
FIGS. 19 through 29 illustrate cross-sectional views of various processing steps during formation of a redistribution structure in accordance with some other embodiments.

Referring to FIG. 19, a package structure similar to FIG. 5 is provided. In FIG. 19, a patterned dielectric portion 230a is provided over the semiconductor dies 110 and 120, the conductive pillars TV and the insulating encapsulant MC. In some embodiments, the dielectric portion 230a is formed with a thickness T1 similar to the dielectric portion 130a. The dielectric portion 230a is patterned to form openings 243 exposing the conductive pillars TV, the semiconductor dies 110 and the semiconductor dies 120. The formation and patterning of dielectric portion 230a may be similar to dielectric portion 130a as discussed above with reference to FIG. 6. Details of which are not repeated.

Figure 20:
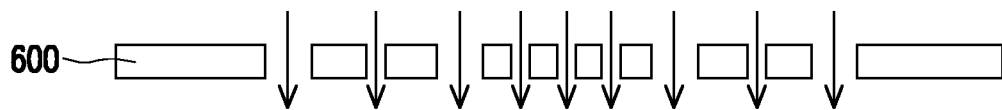
Figure 20:
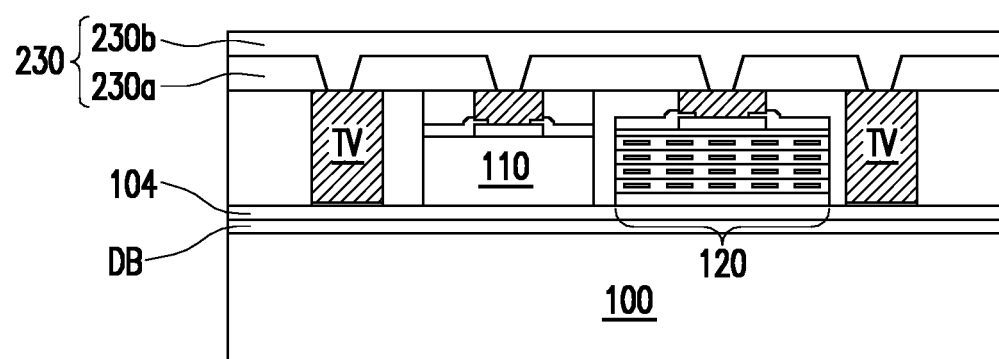

Referring to FIG. 20, a dielectric portion 230b is deposited into the openings 234 and over the dielectric portion 230a. The dielectric portion 230b is formed of a positive tone photosensitive dielectric material such as PBO, polyimide, BCB, phenolic, acrylate, phenolic-epoxy hybrid, or the like. The dielectric portion 230b may be formed by any acceptable deposition process, such as spin coating, chemical vapor deposition (CVD), laminating, the like, or a combination thereof. The use of positive tone photosensitive dielectric material allows openings with smaller dimension to be formed in subsequent patterning (i.e. exposure and developing) processes. In detail, a patterned photomask 600 is used to expose the dielectric portion 230b to a light source (e.g. UV light source). The photomask 600 may have opaque portion which blocks and patterned transparent portions which allows light to pass through, as seen in arrows of FIG. 20.

Figure 21:
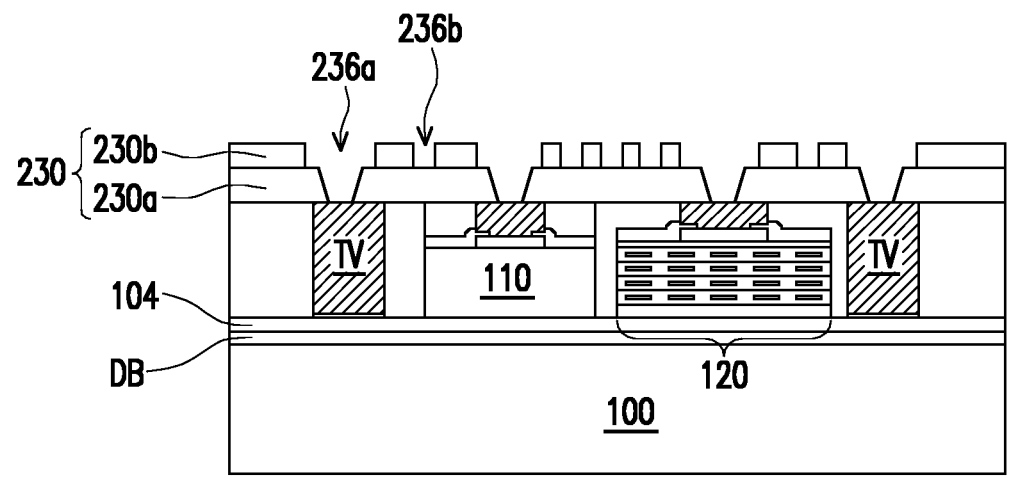

After the exposure, the exposed portions of the dielectric portion 230b is chemically altered and may be removed by use of developing solution. After removal of exposed portion, a patterned dielectric portion 230b with openings 236a and openings 236b are formed, as shown in FIG. 21. Openings 236a expose the portions of dielectric portion where opening 234 are formed, thus exposing the conductive pillar TV and the semiconductor die 110 and the semiconductor die 120. Openings 236b exposes the portions of the dielectric portion 230a. In some embodiments, openings 236b correspond to trenches that extends along the top surface of the dielectric portion 230a.

In FIG. 22, a seed layer SL2 is formed on the patterned dielectric portion 230a, exposed portions of the dielectric portion 230a and the exposed portions of the conductive pillar TV and the semiconductor dies 110 and 120. That is, the seed layer SL2 is formed on the dielectric portion 230b and conformal to the shape of the openings 236a and openings 236b. The seed layer SL2 may be formed using, for example PVD or the like. The PVD may be sputtering. In some embodiments, the seed layer SL2 is a metal layer, which may be a single layer or a composite layer comprising sub-layers formed of different materials. In some embodiments, the seed layer SL2 includes a titanium layer and a copper layer over the titanium layer.

Referring to FIG. 23, a conductive material 234 is then formed over the seed layer filling the openings 236a and the openings 236b. In some embodiments, the conductive material may be formed by plating, such as electroplating, electroless plating, or the like. The conductive material may be a metal such as copper, titanium, tungsten, aluminum, or the like. The conductive material is formed to a level that is above the top surface of the seed layer SL2 disposed thereunder.

Referring to FIG. 24, the conductive material 234, seed layer SL2 and dielectric portion 230b are partially removed and planarized to define the conductive features 238a and conductive features 238b. That is, the excess portion of the conductive materials 234 and the seed layer SL2 are removed. The partial removal and planarization process removes conductive material 234 and seed layer SL2 that are disposed above the top surface of the dielectric portion 230b. Accordingly, any conductive material 234 and/or seed layer SL2 that electrically connects conductive material disposed in any two adjacent openings 236a and openings 236b are removed, leaving behind a substantially leveled top surface. In some embodiments, the partial removal and planarization of the conductive material 234, seed layer SL2 and dielectric portion 230b may be performed by a grinding process and/or a planarization process such as a chemical mechanical polishing (CMP) process. In some embodiments, the thickness T3 of the dielectric portion 230b after the planarization process may between about 0.2 µm to about 0.9 µm.

Still referring to FIG. 24, the conductive features 238a refer to the portion of conductive material embedded in the dielectric portion 230a. That is, the conductive features 238a are conductive vias which electrically connect the conductive pillar TV and the semiconductor dies 110 and 120 to the conductive features 238b disposed above the conductive features 238a. The conductive features 238b refer to conductive features that is embedded in the dielectric portion 230b. In a top view (not shown), the conductive features 238b may be illustrated as fine pitched conductive traces that extends along the surface of the dielectric portion 230a for increased routing density.

In some embodiments, the conductive features 238a may have dimensions similar to the conductive features 138a discussed above with reference to FIG. 9. In some embodiments, the conductive features 238b may have dimensions similar to the conductive features 138b discussed above with reference to FIG. 9. In some embodiments, the critical dimension of the conductive features 238b is smaller than the critical dimension of the conductive features 238a. In some embodiments, the critical dimension of the conductive features 238a may be between about 1.0 µm to about 5.0 µm. In some embodiments, the critical dimension of the conductive features 238b may be between about 0.2 µm to about 0.9 µm.

Figure 25:
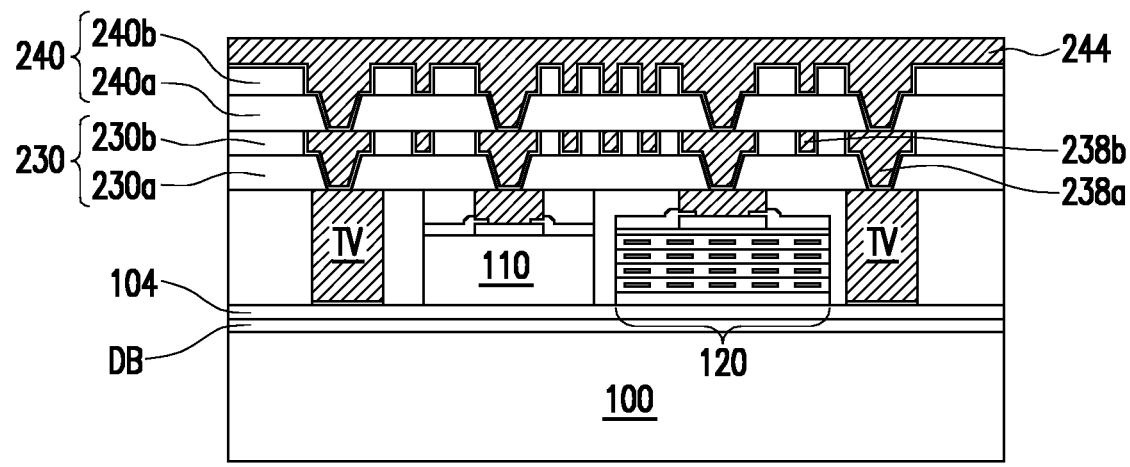
Figure 26:
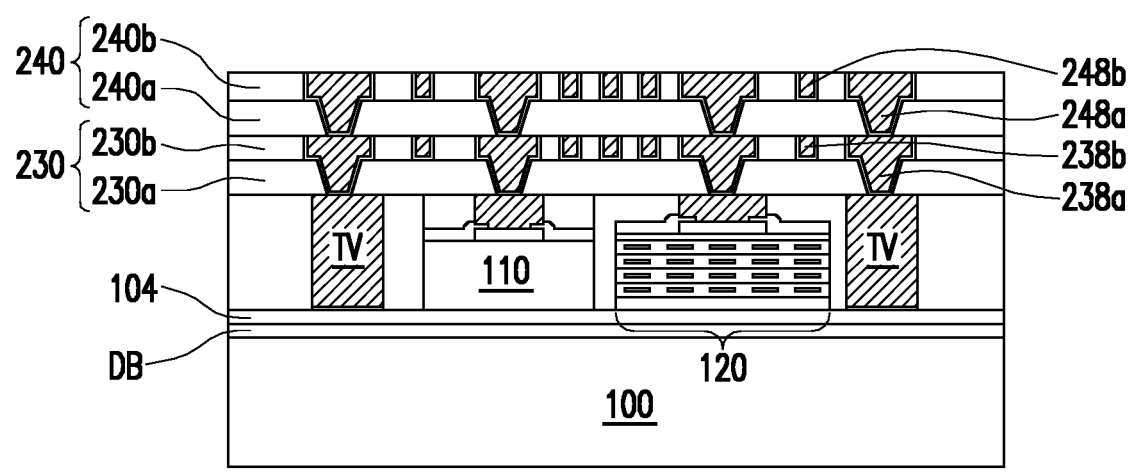

FIGS. 25 through 26 illustrates the formation of additional RDL 240 over the first RDL 230. The RDL 240 includes dielectric portion 240a, dielectric portion 240b, conductive features 248a and conductive features 248b. The materials used and the process of forming the RDL 240 may be the same as the process of forming RDL 230 illustrated in FIGS. 19 through 24.

In some embodiments, the RDL 240 is a fine pitch RDL for high density routing having critical dimensions similar to the RDL 230. In other words, the dielectric portion 240a may be similar to the dielectric portion 230a, the dielectric portion 240b may be similar to the dielectric portion, the conductive features 248a may be conductive vias that is similar to conductive features 238a, and the conductive features 248b may be redistribution lines formed above conductive features 248a that is similar to conductive features 238b. In an alternative embodiment, the formation of the RDL 240 is omitted. That is, only one fine pitch RDL 230 is formed. In some other embodiment, more than one additional fine pith RDL 240 may be formed on the RDL 230. That is, the processes of FIGS. 19 through 24 may be repeatedly performed on RDL 230.

Due to the removal of excess conductive material 234 and planarization to form the conductive features 238a and conductive features 238b discussed above with reference to FIG. 24, a surface with high DOP is provided for additional fine pitch RDL 240 to be formed thereon. The high DOP allows the RDL 240 to be formed with larger process window, thus increasing the yield rate of fine pitch packaging process. That is, due to the top surface of RDL 230 having good surface planarity, the dielectric portion 240a and dielectric portion 240b may be formed with high DOP thereon. Subsequent patterning (i.e. photolithography) process performed thereon may have good resolution, and fine pitch RDL 240 may be achieved.

Figure 27:
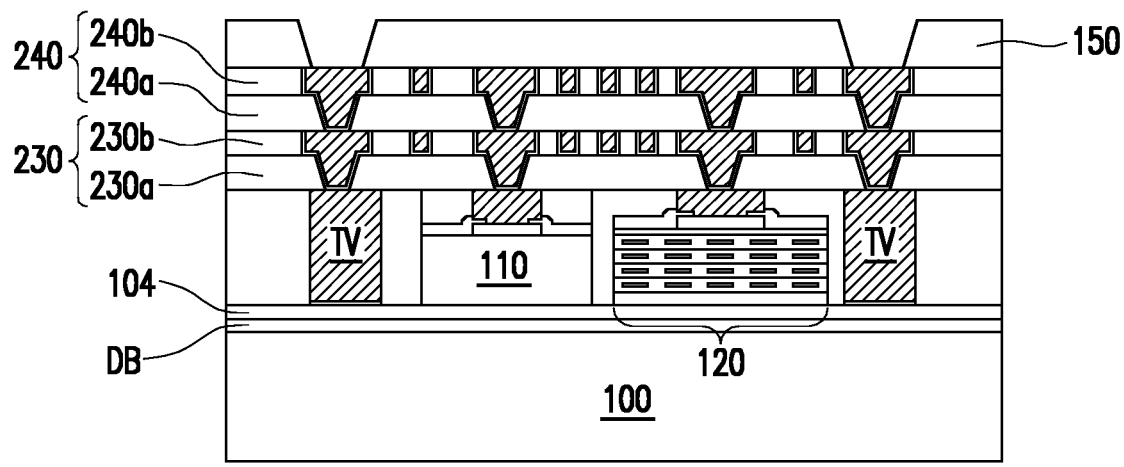
Figure 28:
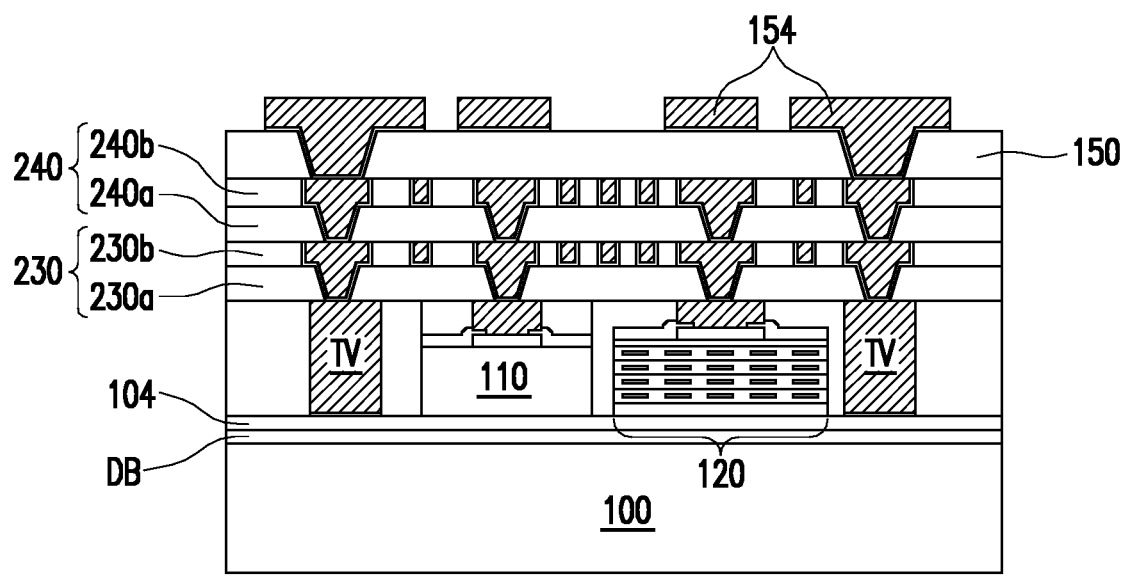
Figure 29:
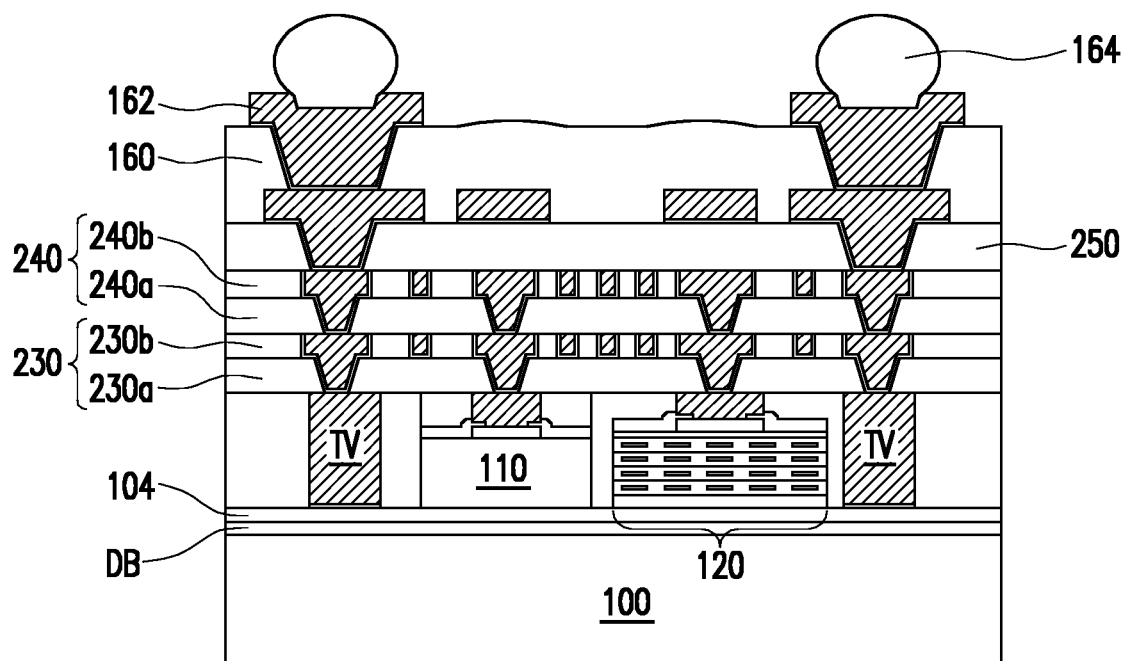

Referring to FIGS. 27 through 29, after the RDL 240 is formed, a large scaled RDL and conductive connectors 164 are formed. The large scaled RDL includes dielectric portion 250, dielectric portion 160, conductive features 154 and UBM 162. In FIG. 27, a dielectric portion 250 is formed over the RDL 240. The top surface of the dielectric portion 250 may be substantially level due to the removal planarization of RDL 240. In some embodiments, the dielectric portion 250 is formed of a photosensitive dielectric material similar to the dielectric portion 150. The dielectric portion 250 may then be patterned to form opening exposing some conductive features 248b. In FIG. 28, conductive features 154 are formed in the patterned opening of dielectric portions 250 and on the top surface of the dielectric portion 250. In some embodiment, the conductive features 154 are formed with a seed layer as discussed above with reference to FIG. 14. Here, the conductive features 154 collectively refer to the conductive features which connects conductive feature 248b to the top surface of the dielectric portion 250 and conductive features which is above the dielectric portion 250 which performs redistribution function.

In FIG. 29, a dielectric portion 160, an under-ball metallurgy (UBM) 162 and conductive connector 164 are formed with the similar material and method as discussed above with reference to FIG. 15. The details of which are not repeated herein. Although not illustrated, after the formation of conductive connector 164, the package may be de-bonded from the carrier 100 and flipped over for subsequent bonding to a package 300 and singulation process, similar to the process described with reference to FIGS. 16 to 18.

FIGS. 30 through 35 illustrate cross-sectional views of various processing steps during formation of a redistribution structure in accordance with some other embodiments. A single package region is illustrated in FIGS. 30 through 35, but multiple package regions may be packaged simultaneously, constituting a wafer level packaging process.

Figure 31:
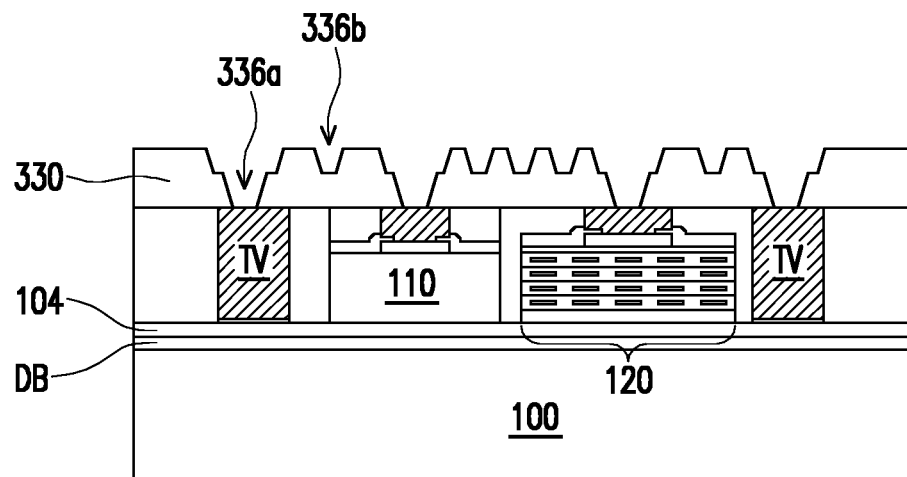
Figure 32:
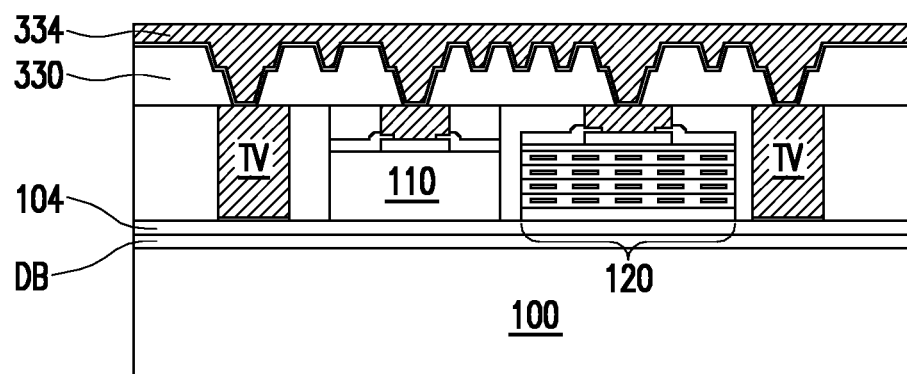
Figure 33:
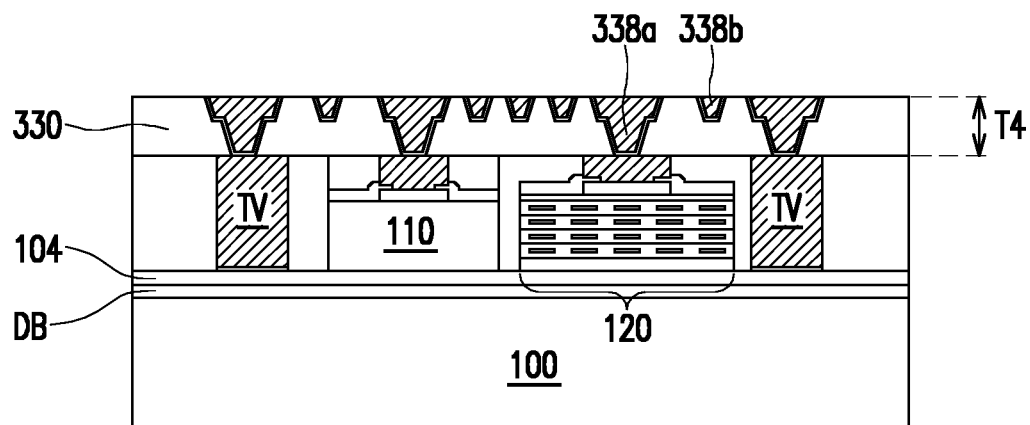

Referring to FIGS. 30 through 33, an RDL is formed over the semiconductor dies 110 and 120, the conductive pillars TV and the insulating encapsulant MC. As illustrated in FIG. 33, the RDL includes a dielectric layer 330, conductive features 338a and conductive features 338b. Conductive features 338a and conductive features 338b are referred to as redistribution lines. In some embodiments, conductive features 338a and conductive features 338b are formed by a damascene process, more particularly, a dual damascene process, described in greater detail below. In some embodiments, the RDL is a fine pitch RDL having critical dimension less than 1.0 μm.

Figure 30:
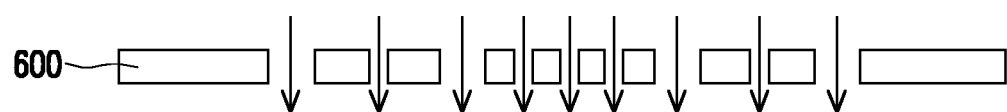
FIGS. 30 through 35 illustrate cross-sectional views of various processing steps during formation of a redistribution structure in accordance with some other embodiments.
Figure 30:
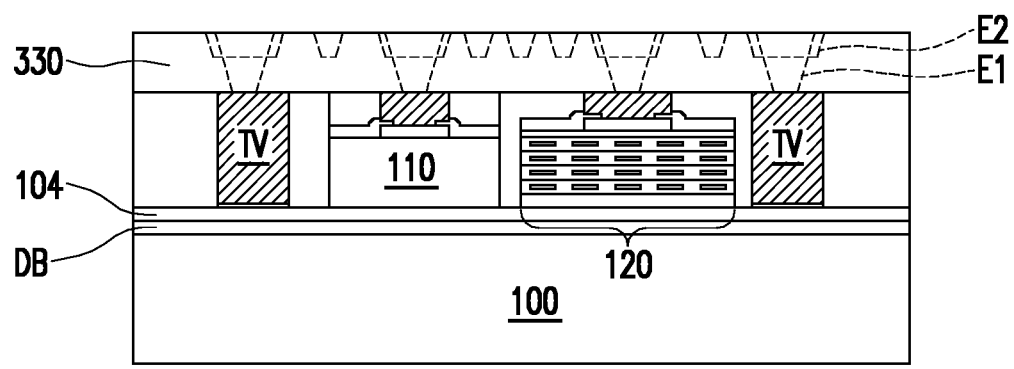

Referring to FIG. 30, a package structure similar to FIG. 5 is provided. In FIG. 30, a dielectric layer 330 is provided over the semiconductor dies 110 and 120, the conductive pillars TV and the insulating encapsulant MC. The dielectric layer 330 is formed of a positive tone photosensitive dielectric material such as PBO, polyimide, BCB, phenolic, acrylate, phenolic-epoxy hybrid, or the like. The dielectric layer 330 may be formed by any acceptable deposition process, such as spin coating, chemical vapor deposition (CVD), laminating, the like, or a combination thereof. The use of positive tone photosensitive dielectric material allows openings with smaller dimension to be formed in subsequent patterning (i.e. exposure and developing) processes.

Still referring to FIG. 30, after forming the dielectric layer 330, the dielectric layer 330 is patterned by photolithography using a patterned photomask 600. The photomask 600 may have opaque portion which blocks and patterned transparent portions which allows light to pass through, as seen in arrows of FIG. 30. During the exposure process including one or more exposure steps, two regions E1 and E2 of the dielectric layer are exposed to the patterned light. Referring to FIG. 30, region E1 refers to the region with dashed lines which extends from the top surface of the dielectric layer 330 through to the bottom surface of the dielectric layer 330. Region E2 refers to the region with dashed lines which extends from the top surface of the dielectric layer 330 into dielectric layer 330 but not through to the bottom surface of the dielectric layer. Both regions correspond to individual tapered openings in the subsequent removal of the regions E1 and regions E2.

In some embodiments, when the exposure process is a two-step process, regions E1 may first be exposed to patterned light using a first photomask before exposing region E2 using a second photomask or vice versa. In some embodiment, the exposure to regions E1 and regions E2 may be performed simultaneously in a single step using a half-tone photomask. After the exposure, the exposed portions of the dielectric layer 330 is chemically altered and may be removed by use of developing solution. After removal of exposed portions, a patterned dielectric layer 330 with openings 336a and openings 336b are formed, as shown in FIG. 31. Openings 336a are vias exposing the conductive pillar TV, the semiconductor die 110 and the semiconductor die 120. Openings 336b are recesses formed in the dielectric layer 330. In some embodiments, openings 336b correspond to trenches that extends along the dielectric layer 330.

Referring to FIG. 32, a seed layer is formed on the patterned dielectric layer 330, the exposed portions of the conductive pillar TV and the semiconductor dies 110 and 120. That is, a seed layer is formed on the dielectric portion 230b and conformal to the shape of the openings 336a and openings 336b. In some embodiments, the seed layer is formed with the material and method similar to the seed layer SL2 discussed above with reference to FIG. 22. After forming seed layer, a conductive material 334 is then formed over the seed layer filling the openings 336a and the openings 336b to a level that is above the top surface of the seed layer disposed thereunder. In some embodiments, the conductive material 334 is formed with the material and method similar to the conductive material 234 discussed above with reference to FIG. 23.

Referring to FIG. 33, the conductive material 334, seed layer and dielectric layer 330 are partially removed and planarized to define the conductive features 338a and conductive features 338b. That is, the excess portion of the conductive materials 334 and the seed layer are removed. The partial removal and planarization process removes conductive material 334 and seed layer that are disposed above the top surface of the dielectric layer 330 similar to the removal of conductive material 234 discussed above with reference to FIG. 24. Accordingly, a substantially leveled top surface is formed. In some embodiments, the thickness T4 of the dielectric layer 330 after the planarization process may be between about 1.2 μm to about 5.9 μm.

Still referring to FIG. 33, the conductive features 338a refer to the portion of conductive material extending from the bottom surface of the dielectric layer 330 to the level of the bottom surface of opening 336b (shown in FIG. 31). That is, the conductive features 338a are conductive vias which electrically connect the conductive pillar TV and the semiconductor dies 110 and 120 to the conductive features 338b disposed above the conductive features 338a. The conductive features 338b refer to conductive features that formed in openings corresponding to region E2. In a top view (not shown), the conductive features 338b may be illustrated as fine pitched conductive traces that extends along the surface of the dielectric layer 330 for increased routing density.

In some embodiments, the conductive features 338a may have dimensions similar to the conductive features 138a discussed above with reference to FIG. 9. In some embodiments, the conductive features 338b may have dimensions similar to the conductive features 138b discussed above with reference to FIG. 9. In some embodiments, the critical dimension of the conductive features 338b is smaller than the critical dimension of the conductive features 338a. In some embodiments, the critical dimension of the conductive features 338a may be between about 1.0 μm to about 5.0 μm. In some embodiments, the critical dimension of the conductive features 338b may be between about 0.2 μm to about 0.9 μm.

Figure 34:
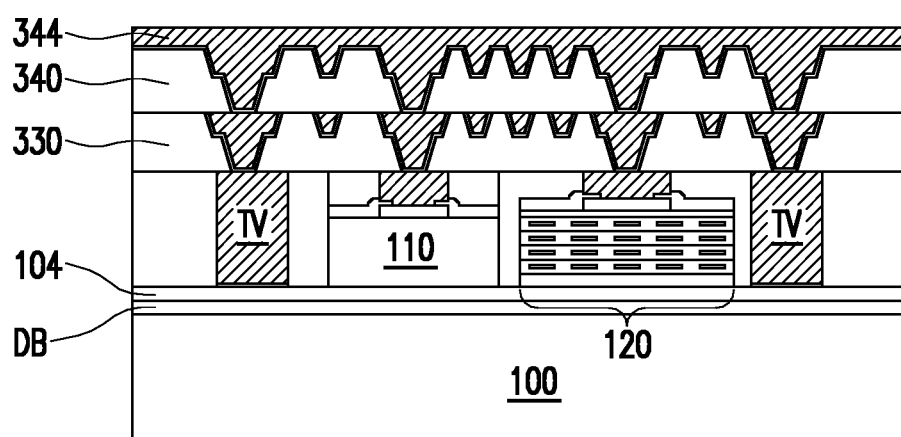

FIG. 34 illustrates the formation of additional RDL similar to the RDL discussed with reference to FIGS. 30 through 32. The additional RDL includes dielectric layer 340 and conductive material 344. The materials used and the process of forming the dielectric layer and conductive material 344 may be the same as the process illustrated in FIGS. 30 through 32.

Figure 35:
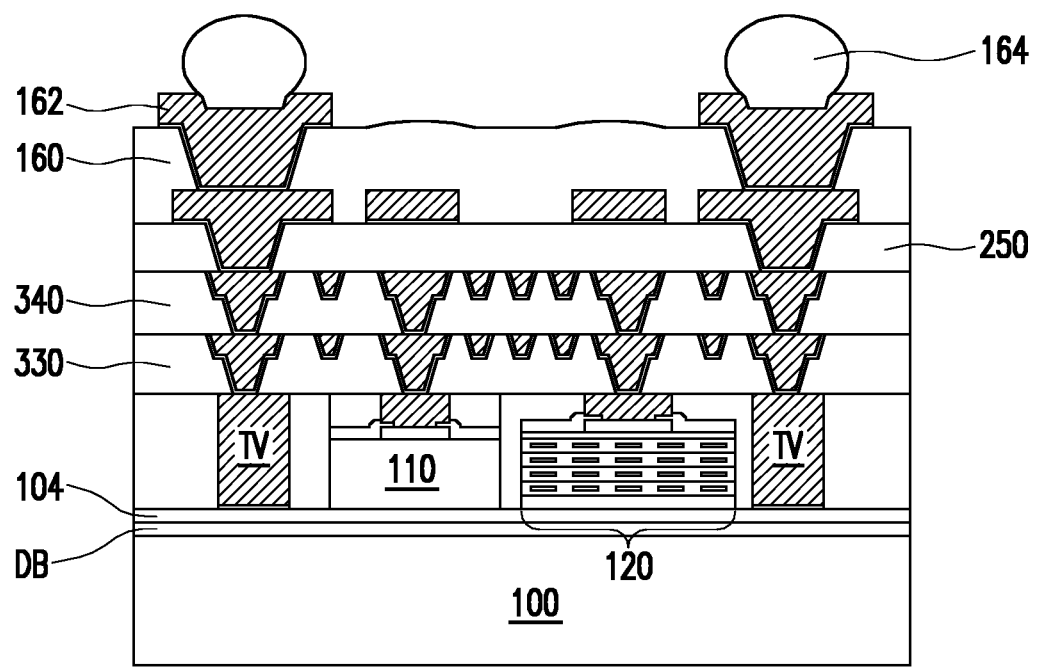

Referring to FIG. 35, excess portion of the conductive material 344 is removed and planarization is performed on the dielectric layer 340. After planarization process, dielectric layer 340 include conductive features embedded therein. The conductive features embedded in dielectric layer 340 correspond to fine pitch redistribution lines similar to that of the conductive features 338a and conductive features 338b. In an alternative embodiment, formation of additional RDL including the dielectric layer 340 and the conductive features embedded therein may be omitted. That is, only one fine pitch RDL is formed. In some other embodiment, more than one additional fine pith RDL may be formed. That is, the processes of FIGS. 30 through 33 may be repeatedly performed to form multiple fine pitch RDLs.

Still referring to FIG. 35, after the fine pitch RDL is formed, a large scaled RDL and conductive connectors 164 are formed. The large scaled RDL includes dielectric portion 250, dielectric portion 160, conductive features 154 and UBM 162. The large scaled RDL may be formed by materials and methods as discussed above with reference to FIGS. 27 through 29. The details of which are not repeated herein. Although not illustrated, after the formation of conductive connector 164, the package may be de-bonded from the carrier 100 and flipped over for subsequent bonding to a package 300 and singulation process, similar to the process described with reference to FIGS. 16 to 18.

In the above-mentioned embodiments, a chip package having a fine pitch RDL for high routing density is provided. To reduce critical dimension of the fine pitch RDL, a surface with high degree of planarization (DOP) is provided for the formation every fine-pitch RDL. By providing high DOP surface, the process window of manufacturing fine pitch RDL may be increased, thereby increasing the yield rate of the package structures having at least one fine pitch RDL. Furthermore, the conductive features in the fine-pitch RDLs are formed by using the damascene (e.g. single damascene or dual damascene) process, allowing fine pitch to be achieved. Moreover, openings (e.g. trenches) defining the conductive features having fine line width or fine line spacing may be patterned on high resolution photoresists or positive-tone photosensitive dielectric layer to effectively decrease the critical dimension.

In accordance with some embodiments of the present disclosure, a chip package including a semiconductor die, an insulating encapsulant encapsulating the semiconductor die; and a first redistribution layer over the semiconductor die and the encapsulant is provided. The first redistribution includes a first redistribution portion and a second redistribution portion in contact with the first redistribution portion, the first redistribution portion being between the second redistribution portion and the semiconductor die, wherein the first redistribution portion includes a first dielectric portion and a plurality of first conductive features embedded in the first dielectric portion, the plurality of first conductive features electrically connecting the semiconductor die to the second redistribution portion, the second redistribution portion includes a second dielectric portion and a plurality of second conductive features embedded in the second dielectric portion and connected to the first conductive features, a top surface of the second dielectric portion is substantially level with top surfaces of the plurality of second conductive features.

In accordance with alternative embodiments of the present disclosure, a method for forming a chip package is provided. The method includes the following steps. Laterally encapsulating a semiconductor die with an insulating encapsulant; forming a first dielectric portion over the insulating encapsulant and the semiconductor die, the first dielectric portion comprising a plurality of via holes, forming a second dielectric portion over the first dielectric portion; and forming a plurality of first conductive features in the plurality of via holes and a plurality of second conductive features connected to the plurality of first conductive features, wherein the plurality of second conductive features are embedded in the second dielectric portion, and a top surface of the second dielectric portion is substantially level with top surfaces of the plurality of second conductive features.

In accordance with yet alternative embodiments of the present disclosure, another method of forming a chip package is provided. The method includes the following steps. Laterally encapsulating a semiconductor die with an insulating encapsulant, forming a redistribution layer, wherein forming the redistribution layer includes: forming a first dielectric layer over the insulating encapsulant and the semiconductor die, the first dielectric layer comprising a plurality of via holes and a plurality of trenches above the via holes, and forming a plurality of first conductive features in the via holes and a plurality of second conductive features in the trenches, wherein a top surface of the first dielectric layer is substantially level with top surfaces of the plurality of second conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
    a semiconductor die laterally encapsulating by an insulating encapsulant;
    a first dielectric portion covering the semiconductor die and the encapsulant;
    conductive vias penetrating through the first dielectric portion and electrically connected to the semiconductor die;
    conductive traces disposed on the first dielectric portion; and
    a second dielectric portion disposed on the first dielectric portion and covering the conductive traces, wherein a first minimum lateral width of a conductive trace among the conductive traces is smaller than a second minimum lateral width of a conductive via among the conductive vias.

2. The chip package of claim 1, wherein the first dielectric portion is in contact with the semiconductor die.

3. The chip package of claim 1, wherein the conductive vias are in contact with and electrically connected to connectors of the semiconductor die.

4. The chip package of claim 3, wherein the conductive vias are in contact with and electrically connected to the connectors of the semiconductor die, and the conductive vias are disposed between the conductive traces and the connectors of the semiconductor die.

5. The chip package of claim 1, wherein the first dielectric portion and the conductive vias are disposed between the second dielectric portion and the semiconductor die.

6. The chip package of claim 1 further comprising a patterned seed layer disposed on bottom surfaces and side surfaces of the conductive vias and bottom surfaces of the conductive traces.

7. The chip package of claim 1, wherein the conductive vias are spaced apart from the insulating encapsulant by the first dielectric portion.

8. The chip package of claim 1, wherein the second minimum lateral width ranges from about 1 micrometer to about 5 micrometers, and the second minimum lateral width ranges from about 0.2 micrometer to about 0.9 micrometer.

9. A method for forming a chip package, comprising:
    laterally encapsulating a semiconductor die with an insulating encapsulant;
    forming a first dielectric portion in contact with the insulating encapsulant and the semiconductor die, the first dielectric portion comprising via holes, wherein connectors of the semiconductor die are exposed by the via holes;
    forming a second dielectric portion on the first dielectric portion, the second dielectric portion comprising trenches above the via holes; and
    forming conductive vias in the via holes and conductive traces in the trenches, wherein a first minimum lateral width of a conductive trace among the conductive traces is smaller than a second minimum lateral width of a conductive via among the conductive vias.

10. The method of claim 9, wherein forming the conductive vias and the conductive traces comprises:
    forming a seed layer covering the first dielectric portion and the second dielectric portion;
    forming a conductive material on the seed layer; and
    removing portions of the conductive material and portions of the seed layer until the second dielectric portion is revealed.

11. The method of claim 10, wherein the portions of the conductive material and the portions of the seed layer are removed through a chemical mechanical polishing process.

12. The method of claim 9, wherein the conductive vias and the conductive traces are formed by a damascene process.

13. The method of claim 9, wherein forming the conductive vias and the conductive traces comprises:
    filling a conductive material in the via holes and the trenches; and
    removing portions of the conductive material to form the conductive vias and the conductive traces.

14. The method of claim 9, wherein the conductive vias are located at a first level height, the conductive traces are located at a second level height, connectors of the semiconductor die are located at a third level height, and the first level height is between the second level height and the third level height.

15. A method for forming a chip package, comprising:
    laterally encapsulating a semiconductor die with an insulating encapsulant;
    forming a first dielectric portion over the insulating encapsulant and the semiconductor die, the first dielectric portion being in contact with the insulating encapsulant and the semiconductor die, and the first dielectric portion comprising via holes;
    forming a second dielectric portion, the second dielectric portion comprising first trenches located above the via holes and second trenches separated from the first trenches; and
    forming conductive vias in the via holes, first conductive traces in the first trenches and second conductive traces in the second trenches, wherein a first minimum lateral width of a second conductive trace among the second conductive traces is smaller than a second minimum lateral width of a conductive via among the conductive vias.

16. The method of claim 15, wherein a minimum lateral width of a via hole among the via holes is greater than a minimum lateral width of a second trench among the second trenches.

17. The method of claim 15, wherein the conductive vias, the first conductive traces and the second conductive traces are formed by a damascene process.

18. The method of claim 15, wherein forming the conductive vias in the via holes, the first conductive traces in the first trenches and the second conductive traces in the second trenches comprises:
    forming a conductive material filling the via holes, the first trenches and the second trenches, and the conductive material covering a top surface of the second dielectric portion; and
    removing the conductive material outside the via holes, the first trenches and the second trenches until the top surface of the second dielectric portion is exposed.

19. The method of claim 15, further comprising:
    forming a third dielectric portion on second dielectric portion to cover the first conductive traces and the second conductive traces.

20. The method of claim 15, wherein forming the conductive via, the first conductive traces and the second conductive traces comprises:
    forming a seed layer on the first dielectric portion and the second dielectric portion,
    forming a conductive material on the seed layer, the conductive material filling the via holes, the first trenches and the second trenches; and removing the conductive material outside the via holes, the first trenches and the second trenches until a top surface of the second dielectric portion is exposed.

\* \* \* \* \*